United States Patent
Lubomirsky et al.

(10) Patent No.: US 6,326,597 B1
(45) Date of Patent: Dec. 4, 2001

(54) TEMPERATURE CONTROL SYSTEM FOR PROCESS CHAMBER

(75) Inventors: Dmitry Lubomirsky, Cupertino; Allen I. D'ambra, Millbrae; Edward L Floyd, Santa Clara; Qiwei Liang, Fremont; Daniel J Hoffman, Saragota; Victor H Fuentes, Sunnyvale; Simon Yavelberg, Cupertino; Jerry C Chen, Santa Clara, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/292,726

(22) Filed: Apr. 15, 1999

(51) Int. Cl.[7] .................................................. B23K 10/00
(52) U.S. Cl. ................... 219/494; 219/121.43; 156/345; 118/723 R
(58) Field of Search ................ 219/497, 121.4, 219/121.41, 121.43, 121.52, 121.51; 118/724, 725, 723 I, 723 R; 156/345, 646.1

(56) References Cited

U.S. PATENT DOCUMENTS

| | | | |
|---|---|---|---|
| 4,448,354 | 5/1984 | Reznick et al. | 239/265.17 |
| 4,540,361 | * 9/1985 | Gagne | 432/30 |
| 4,765,373 | * 8/1988 | Munroe | 137/890 |
| 5,062,386 | * 11/1991 | Christensen | 118/725 |
| 5,160,545 | 11/1992 | Maloney et al. | 118/725 |
| 5,402,938 | 4/1995 | Sweeney | 239/431 |
| 5,777,289 | 7/1998 | Hanawa et al. | 219/121.43 |

* cited by examiner

Primary Examiner—Mark Paschall
(74) Attorney, Agent, or Firm—Janah and Associates

(57) ABSTRACT

Temperature control of a process chamber 25 is achieved by directing a flow of gas at an external surface 100 of the chamber 25. In one aspect, gas directed at the chamber 25 passes through a gas flow amplifier 115 that increases the gas flow. Gas for the temperature control can be drawn in from the ambient air and, after passing over the process chamber 25, the gas can flow out through an outlet 150. Data is presented demonstrating superior temperature control performance over a conventional system.

56 Claims, 5 Drawing Sheets

TEMPERATURE CONTROL SYSTEM FOR PROCESS CHAMBER

BACKGROUND

The present invention relates to a temperature control system for process chambers.

In the fabrication of devices for electronic applications, semiconductor, dielectric and conductor materials, such as for example, polysilicon, silicon dioxide, and metal containing layers, are deposited on a substrate and etched to form features such as gates, vias, contact holes and interconnect lines. These features are typically formed by chemical vapor deposition (CVD), physical vapor deposition (PVD), oxidation and etching processes. For example, in a typical etching process, a patterned mask of photoresist or oxide hard mask is formed on a deposited layer by photolithographic methods and exposed portions of the deposited layer are etched by an energized halogen gas, such as $Cl_2$, HBr and $BCl_3$. In a typical CVD process, a gas provided in the chamber is decomposed to deposit a layer on the substrate. In PVD processes, a target facing the substrate is sputtered to deposit the target material onto the substrate. In all of these processes, the substrate is transported into a process chamber, a desired composition of process gas is introduced into a chamber, and plasma is formed from the process gas by energizing an inductor antenna or electrodes to process the substrate.

Temperature control systems are used to control the temperatures of the process chambers because the deposition and etching processes are often highly temperature dependent. For example, in etching processes, the shape of the etched features is often dependent upon process temperature which can change across the substrate surface. In CVD and PVD processes, the rate of deposition of material is highly dependent upon the temperature of the substrate. Another problem arises from the residues formed on chamber surfaces, which flake off and contaminate the substrate when subjected to thermal stresses arising from changing temperatures that occur when, for example, the plasma is de-energized during transport of the substrate in and out of the chamber. Thus, it is desirable to control the temperature of the chamber surfaces and reduce temperature fluctuations from one process cycle to another.

Conventional temperature control systems include water-jacket recirculating systems and forced-air cooling systems. Water-jacket systems recirculate water through cooling channels that surround the chamber. However, the cooling channels occupy valuable space around the chamber that is often needed for placement of other external components. Also, because both the cooling fluid itself and the metal channel can absorb RF energy, it is difficult to place and position the channels around a chamber that has inductor coils for coupling inductive energy into the chamber. The presence of inductor coils render it difficult to control the temperature of an underlying or adjacent chamber surface. In addition, because the cooling channel has to circumvent around the external components, localized hot spots often occur at locations bypassed by the cooling channels. It is also difficult to obtain uniform heat transfer rates across the chamber because the cooling channels are hard to attach to complex shaped or convoluted chamber surfaces.

Forced air cooling systems, such as those described in U.S. Pat. No. 5,160,545, issued Nov. 3, 1992, which is incorporated herein by reference, typically use a fan to blow air across the chamber surfaces and through a heat exchanger for cooling. However, portions of the chamber surface that are shielded from the cooling air by components become hotter than other unshielded portions, as for example, described in the background of U.S. patent application Ser. No. 09/057,097 to Kholodenko et al. entitled "Temperature Control System for Semiconductor Process Chamber," filed Apr. 8, 1998, now U.S. Pat. No. 6,015,465, which is incorporated herein by reference. Kholodenko et al. also state that because the primary mode of heat transfer is conduction through contact with gas molecules, forced air systems require large flow rates to control large temperature fluctuations, such as the temperature changes caused by turning on and off the plasma or other heat loads. Kholodenko et al. further state that large air flow rates require large fans which upon failure can severely damage other components present around the fan.

For example, a typical forced air conventional system 2 for controlling the temperature of a process chamber 3 is shown in FIG. 1. In this system, heat lamps 4 maintain the temperature stable during idle and run modes, and the plasma generated during a process run mode provides a further heat load that results in a large temperature fluctuation of the chamber surfaces 5. The plasma heat load is partially dissipated by an overhead fan 6 that is enclosed by a housing 7 and that blows recirculated air onto the surface 5 of the chamber 3. Generally, air flows down across the surface 5 of the chamber 3 up an annular passageway 9 defined by an inner wall 10 and the sides 11 of the housing which includes a heat exchanger 12 formed by cooling coils. The cooled air then re-enters the fan 6 from the sides of the fan blades 13. However, such a forced air system 2 has a cooling ability and response time that is limited to the volumetric flow capacity of the fan 6. In addition, the mechanical vibrations of the fan 6 can cause flaking of deposits formed on the chamber surfaces 5 or movement of the underlying substrate, both of which are undesirable. Furthermore, recirculating air within the enclosed environment has a constant heat load that is difficult to rapidly dissipate.

Thus, despite extensive work over many years, there remains a need for an improved system for controlling the temperatures across a process chamber. It is desirable to have a temperature control system capable of maintaining the surfaces and walls of the process chamber at uniform and stable temperatures even for changing heat loads applied to the chamber. It is also desirable to have a temperature control system that does not absorb RF energy from components such as an inductor antenna.

SUMMARY

The present invention relates to a temperature control system for controlling the temperature of a surface of an apparatus, and is particularly useful for controlling the temperature of a semiconductor processing apparatus comprising a process chamber having a support adapted to hold the substrate in the chamber, a gas distributor adapted to distribute process gas in the chamber, a plasma generator adapted to form a plasma from the process gas, and an exhaust adapted to exhaust spent process gas from the chamber. In one embodiment, the apparatus is a plasma processing apparatus having an inductor antenna abutting a dielectric wall for generating a RF induction field for forming an induction plasma in the process chamber.

In a first aspect, the present invention provides a temperature control system adapted to control the temperature of a surface of a process chamber, the temperature control system comprising a gas flow amplifier adapted to direct a gas toward a surface of the process chamber.

In another embodiment, the present invention provides a substrate processing apparatus including a process chamber comprising a support adapted to hold a substrate during processing of the substrate, the process chamber having a surface; a housing surrounding at least a portion of the surface of the process chamber; and a gas flow amplifier is between the housing and the surface of the process chamber.

In a second aspect, the invention provides a substrate processing apparatus including: a process chamber comprising a support adapted to hold a substrate during processing of the substrate, the chamber having an outside surface; and a housing surrounding at least a portion of the outside surface of the process chamber, the housing having one or more vents to the external environment; and a gas flow circulator in the housing to direct a flow of gas against the outside surface of the chamber.

In a method of the present invention, the temperature of the chamber surface is controlled by directing a primary gas stream having a first flow rate toward the chamber surface to entrain a secondary gas stream to form a combined gas stream that flows toward the chamber surface, the combined gas stream having a second flow rate that is preferably higher than the first flow rate.

In another method of the invention, the temperature of the chamber surface is controlled by providing a first gas stream toward the chamber surface at velocity that is sufficiently high to entrain the flow of a second gas stream that includes the first gas stream against the chamber surface.

DRAWING

These and other features, aspects, and advantages of the present invention will be better understood from the following drawings, description and appended claims, all of which are provided to illustrate examples of the invention, where:

Figure 5:
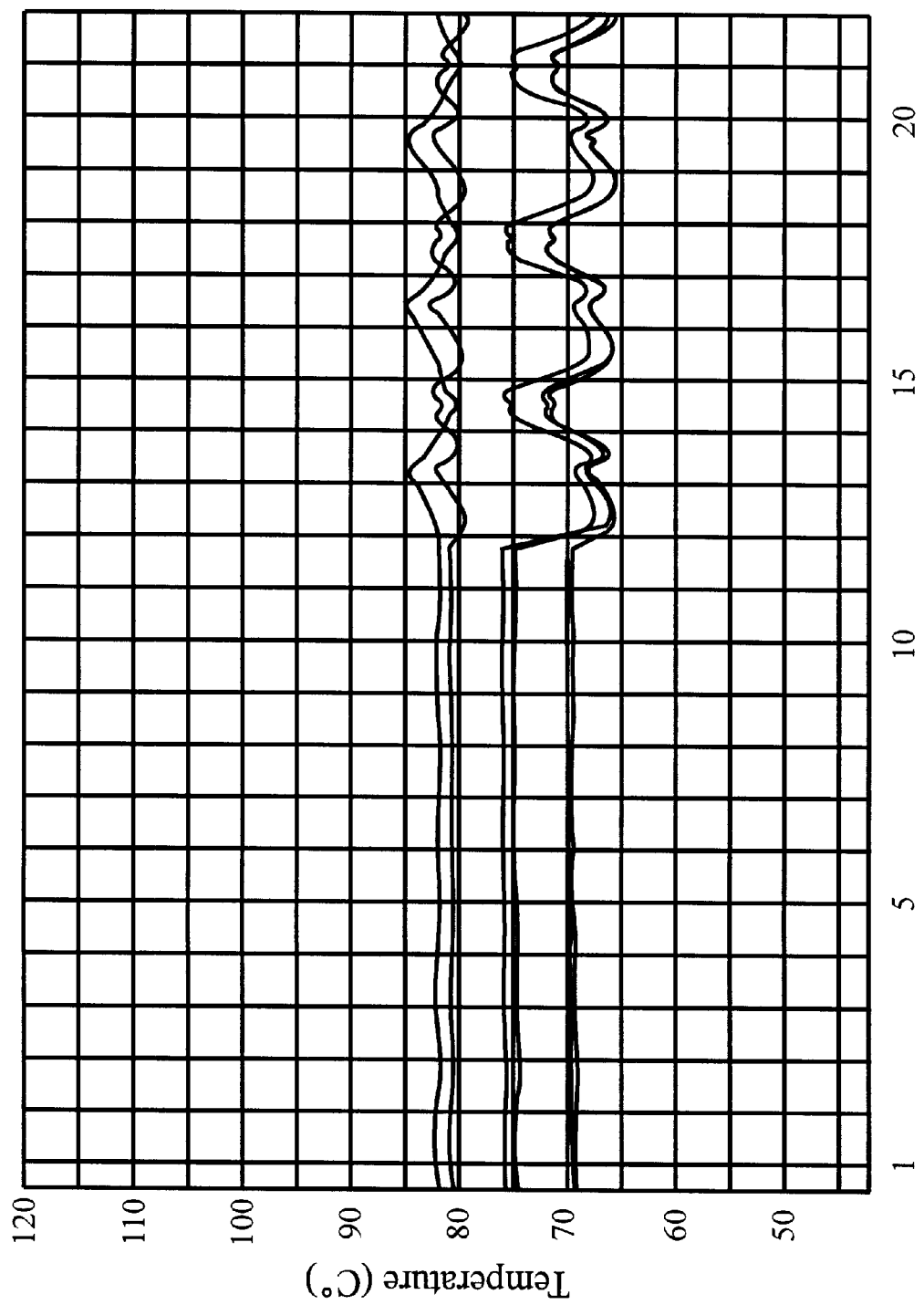
Figure 6:
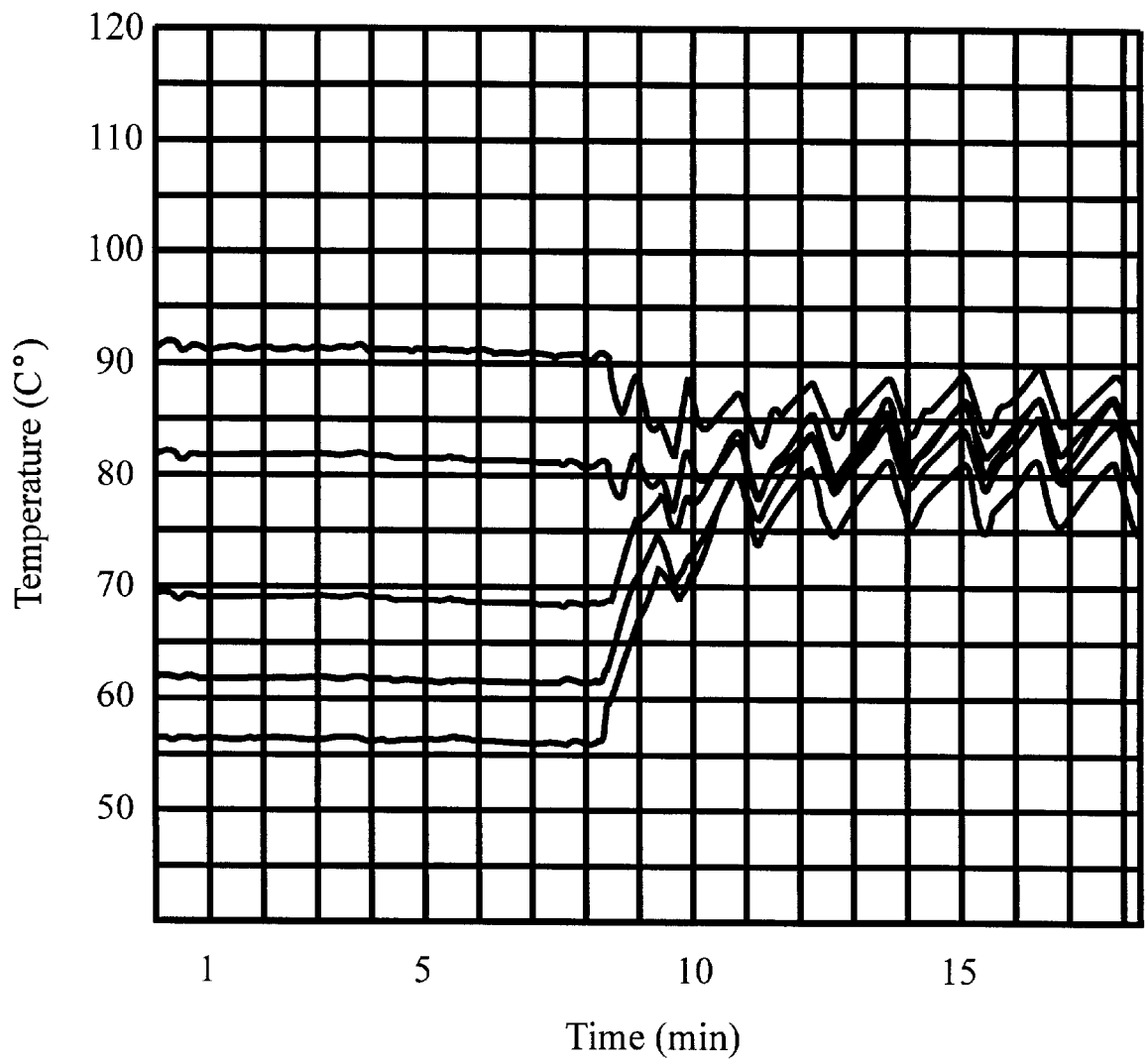

FIG. 5 is a graph of temperature versus time and under conditions of idle, plasma—RF power on, and plasma—RF power off, measured at five points along the outside surface of a process chamber cooled by the temperature control system according to the present invention; and FIG. 6 is a graph of temperature versus time and under conditions of idle, plasma—RF power on, and plasma—RF power off, measured at five points along the outside surface of a process chamber cooled by a conventional temperature control system.

DESCRIPTION

Figure 2:
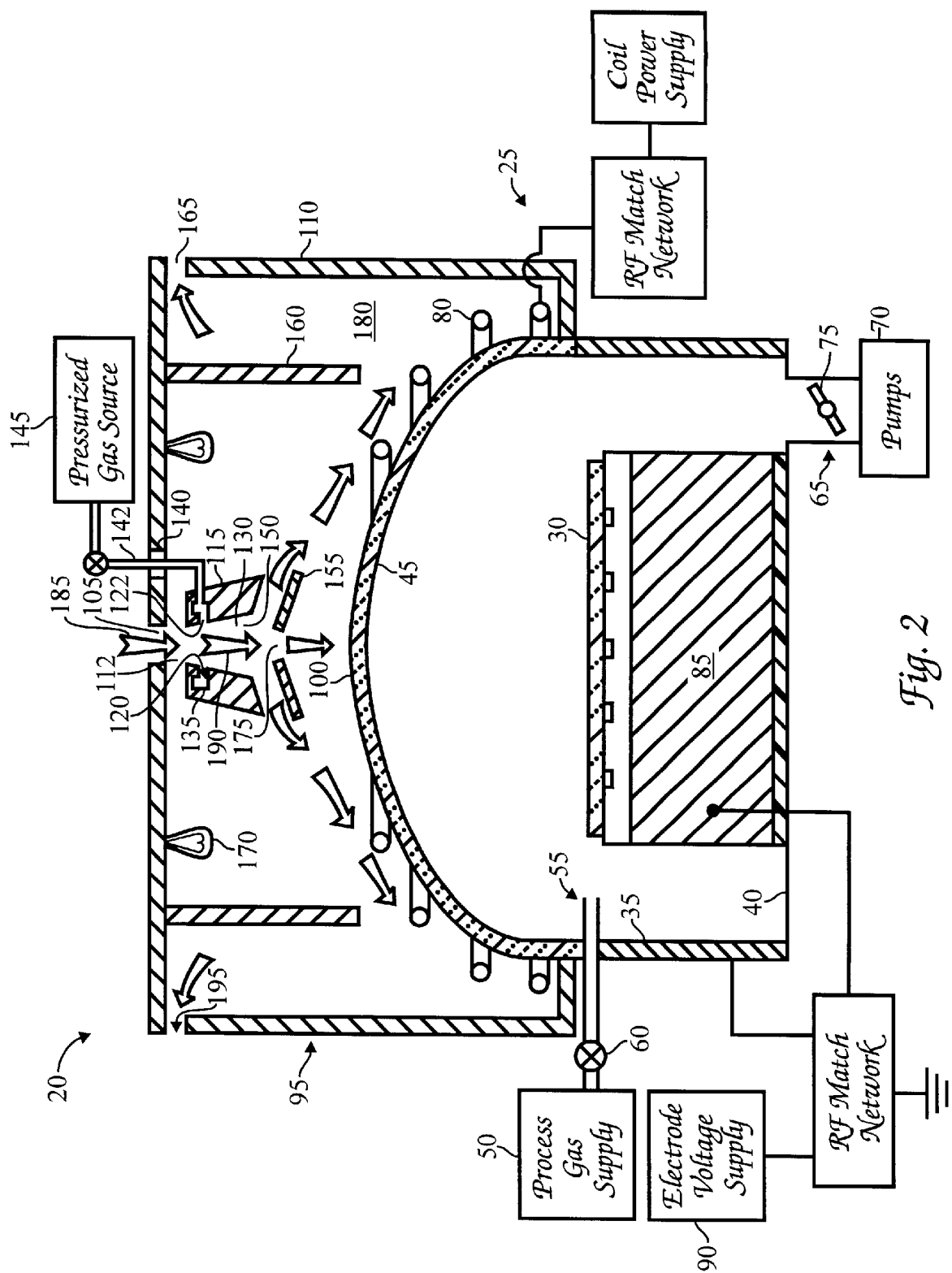
FIG. 2 is a schematic cross-sectional side view of a process chamber according to the present invention.

An exemplary processing apparatus 20 comprising a process chamber is shown in FIG. 2. The particular embodiment of the apparatus 20 (commercially available from Applied Materials Inc., Santa Clara, Calif.) is suitable for plasma etching of semiconductor substrates 30, is provided only to illustrate the invention, and should not be used to limit the scope of the invention. For example, the present invention can also be used for non-plasma process chambers, physical vapor deposition chambers, and chemical vapor deposition chambers.

Figure 1:
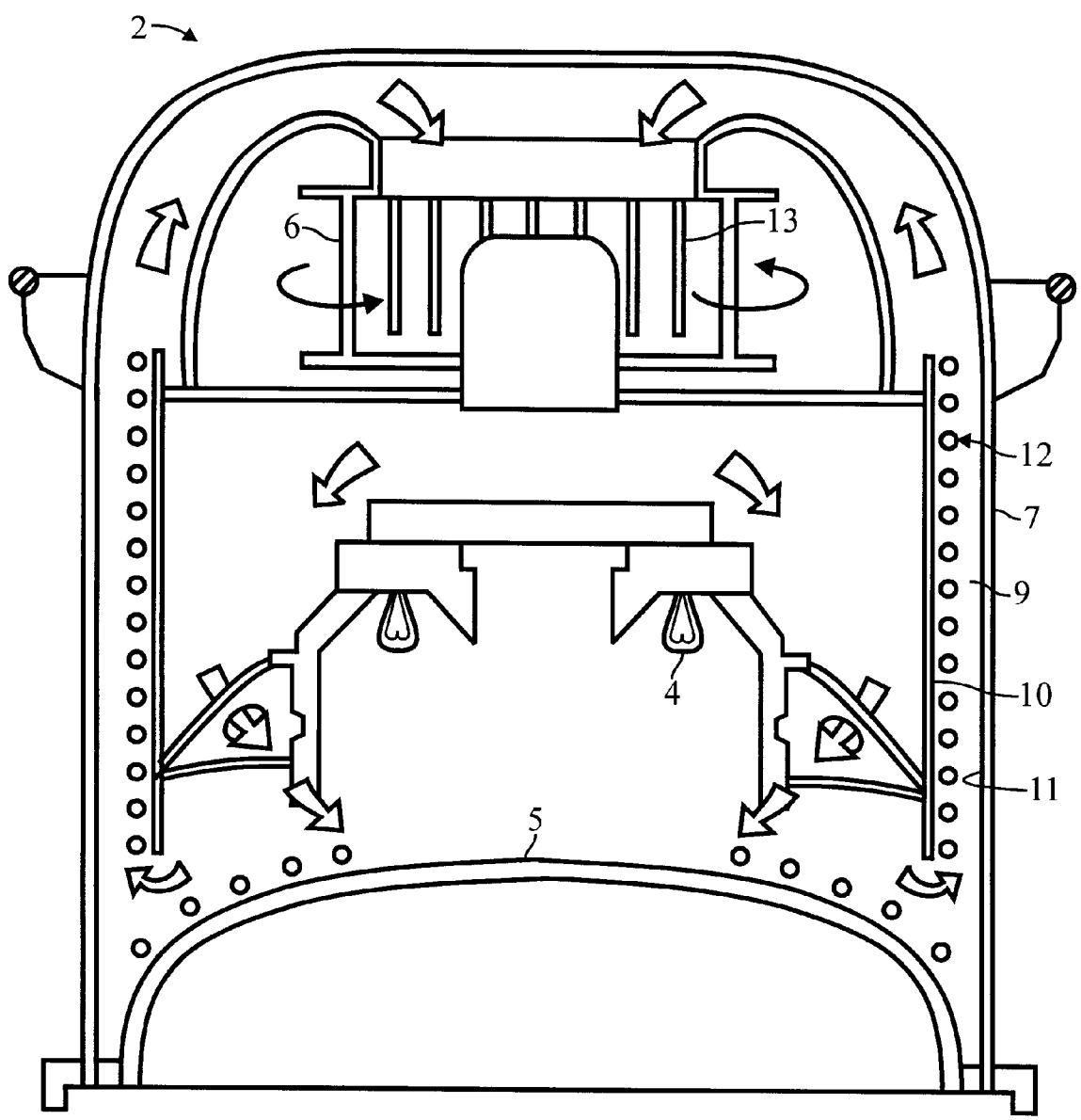
FIG. 1 is a schematic cross-sectional side view of a conventional temperature control system and process chamber.

Particular features of the process chamber 25 illustrated in FIGS. 1 and 2 are described in U.S. Pat. No. 5,777,289, entitled "RF Plasma Reactor with Hybrid Conductor and Multi-Radius Dome Ceiling"; and in U.S. Pat. No. 5,753,044—both of which are incorporated herein by reference. Generally, the process chamber 25 comprises an enclosure having sidewalls 35, a bottom wall 40, and a ceiling 45, and is fabricated from a variety of materials including metals, ceramics, and polymers. Process gas is introduced into the process chamber 25 through a gas distribution system that comprises a process gas supply 50, a process gas distributor 55, and a gas flow controller 60. An exhaust system 65 comprising one or more exhaust pumps 70 (typically including a 1000 liter/sec roughing pump) and throttle valves 75 are used to exhaust spent process gas and to control the pressure of the process gas in the process chamber 25. Preferably, an asymmetric pumping channel 72 surrounding the substrate 30 receives spent gas to exhaust the gas out of the process chamber 25.

The apparatus 20 further comprises an inductor antenna 80 adjacent to the process chamber 25 to generate an inductive field that inductively couples RF power to the process gas in the process chamber for forming a plasma. The inductor antenna 80 preferably comprises multiple coils positioned adjacent to the chamber ceiling 45. In addition to the inductor antenna 80, the ceiling 45 and a substrate support 85 can serve as process electrodes that, when electrically biased relative to one another, capacitively couple to energize the plasma. An electrode voltage supply 90 maintains the process electrodes at different electrical potentials to provide highly directional plasma ions in the process chamber 25.

The ceiling 45 of the process chamber 25 forms a complex shaped surface whose temperature is regulated by the temperature control system 95. The ceiling 45 can be flat or rectangular shaped, arcuate, conical, or dome-shaped, and in one version, comprises a multi-radius dome-shape above the substrate 30 that provides a uniform distribution of plasma induction source power across the entire volume of a plasma zone defined by the ceiling 45, to increase dissociation of process gas in the plasma zone. The ceiling 45 can be made from a dielectric ceramic material, such as quartz or aluminum oxide, that provides low impedance to an RF induction field transmitted by the inductor antenna 80 above the ceiling 45, allowing the RF induction field generated by the inductor antenna 80 to permeate through the ceiling. Alternatively, the ceiling 45 can be made from semiconducting material such as silicon, that serves as an induction field transmitting window, yet is sufficiently electrically conductive to also serve as a process electrode.

Figure 3:
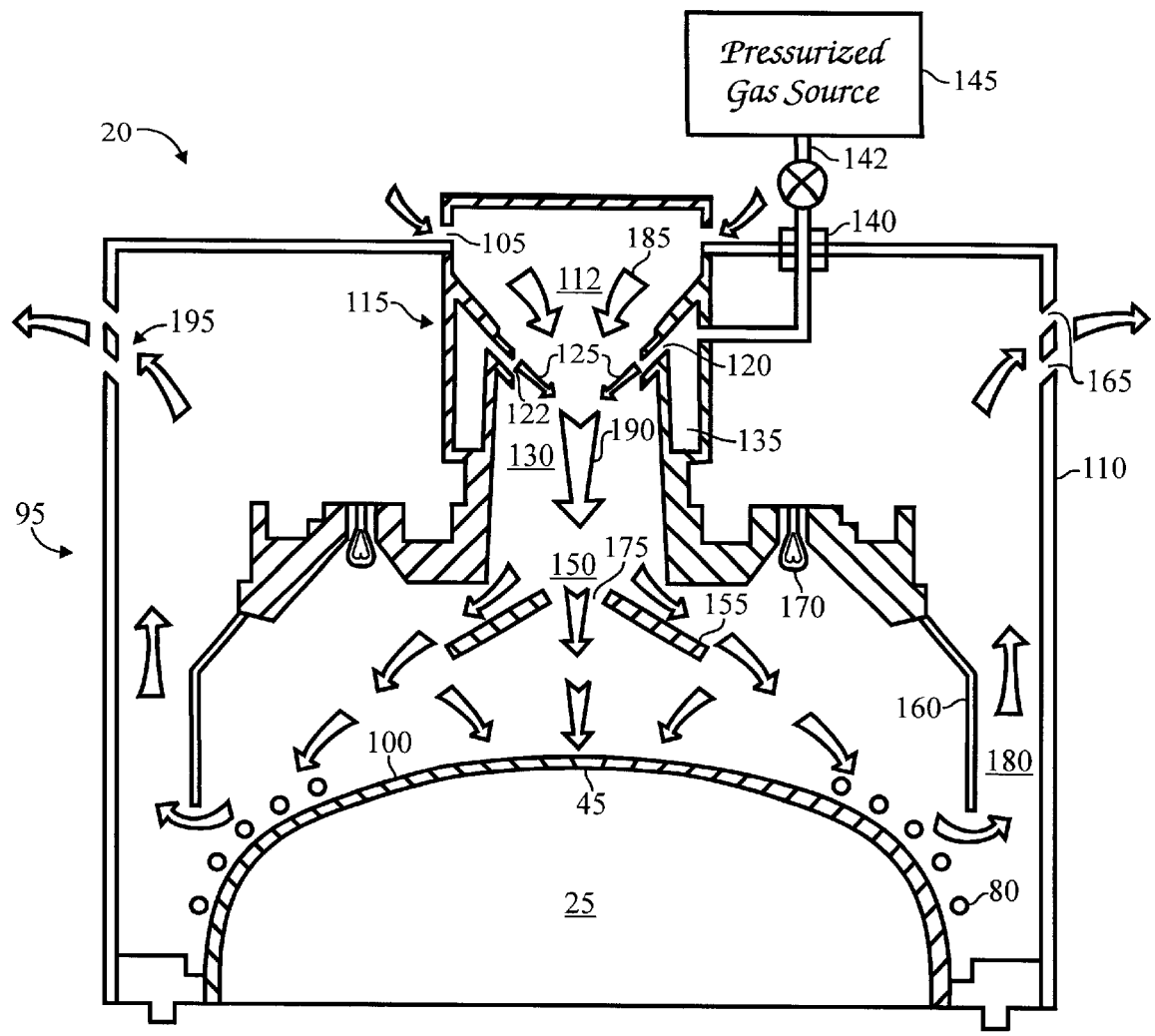
FIG. 3 is a schematic cross-sectional side view of another embodiment of a temperature control system according to the present invention.

An exemplary temperature control system 95 used for controlling a temperature of an external surface 100 of a chamber 25 of a semiconductor processing apparatus 20 is shown in FIG. 3. The temperature control system 95 comprises a gas ingress port 105 forming a duct from outside the housing 110 to an inlet 112 of the gas flow amplifier 115. The gas flow amplifier 115 has a nozzle 120 that directs a narrow stream(s) 125 of high velocity gas in a downward direction into the central opening 130 of the gas flow amplifier 115. High pressure gas can be supplied to the reservoir channel 135 via a gas line connector 140 from an external pressurized gas source 145. The narrow stream 125 of high velocity gas draws or entrains a secondary gas stream 185 through the inlet of the gas flow amplifier 115 resulting in an amplified and relatively large combined gas flow stream 190 exiting or propelled from the outlet 150 of the gas flow amplifier 115 toward the external surface 100 of the chamber 25. Throughout this description, the term "gas flow" refers to volumetric gas flow measured in volume of gas passing a point per unit time. Preferably, a gas deflector 155 is positioned in the flow path to deflect at least a portion of the gas flow toward the sides of the dome-shaped ceiling 45. Inner side walls 160 also can help direct gas flow toward the periphery of the ceiling 45. As gas enters the housing 110 from the gas inlet 112 or from an external cylinder 145, an approximately equal volume of gas is pushed out of the housing 110 through the gas egress port 165. In the embodiment illustrated in FIG. 3, gas flow stream 125 is reflected off (or directed away from) the domed ceiling 45, and/or between the bottom of the housing 110 is pushed upward and between the housing 110 and the inner side walls 160 and this gas flow exits through the gas egress ports 165.

Heat lamps 170 may be used to maintain an elevated and more stable temperature on the external surface 100 of the process chamber 25. The heat lamps 170 may be full spectrum lamps, but are preferably infrared lamps. To balance heat input, it is preferred that the power to the heat lamps 170 is reduced when heat (such as from a plasma) is being generated in the process chamber 25. Other heat sources can also be used, such as resistor heating elements.

Typically, the gas ingress port 105 is a sealed gas duct that connects the external environment with the inlet 112 of the gas flow amplifier 115. The gas in the gas inlet 112 is preferably air drawn in by the vacuum created by the gas flow amplifier 115. In the usual clean room setting, this air is ambient clean room air. In the apparatus illustrated in FIG. 3, the gas ingress port 105 is an essentially straight, rectangular-shaped pipe located adjacent the top of the housing 110.

The gas flow amplifier 115 comprises a central opening 130 having a gas inlet 112 fluidly connected to the gas ingress port 105 to receive surrounding gas; at least one nozzle 120 that releases a high velocity or primary gas stream 125 from the reservoir channel 135 of pressurized gas, through the central opening 130, and out of the amplifier outlet 150 that is adapted to direct the gas toward the surface of the chamber 25. A high pressure gas source feeds gas at a high pressure to the gas line connector 140 that is connected by a gas line 142 to the reservoir channel 135. The pressurized gas is typically at a pressure of about 1 mTorr to about 1000 Torr, and more typically from about 5 to about 100 mTorr. The high velocity gas stream 125 that is directed out of the nozzle 120 flows toward the outlet 150 of the gas flow amplifier 115 at a velocity that is sufficiently high to entrain the flow of gas through the inlet 112, and is often at least about sonic velocities and often at least at about supersonic velocities. The nozzle 120 is located slightly above or slightly below the inlet 112 of the gas flow amplifier 115 and is preferably angled at an angle of 30 to 90 degrees toward the outlet 150 to direct the gas flow in that direction. However, the nozzle 120 can also be horizontal, vertical, or at any other angle. Nonlimiting examples of gas flow amplifiers (also known as air amplifiers, etc.) are described in U.S. Pat. Nos. 4,448,354 and 5,402,938, which are incorporated herein by reference. The relatively narrow and high velocity gas stream 125 flowing from the nozzle 120 entrains a secondary gas stream/flow 185 that is sucked through the inlet 112 and the combined gas flow stream 190 passes through the gas flow amplifier 115 and out of the amplifier outlet 150. Preferably, the nozzle 120 comprises an annular slit or opening 122 that has a circular configuration and preferably extends around a diameter of the gas flow amplifier 115. Preferably, the opening 122 of the nozzle 120 comprises a gap sized from about 0.1 mil to about 50 mil.

Preferably, there is a constriction within the central opening 130 between the inlet and outlet 150 of the gas flow amplifier 115 to further amplify the flow of gas through the gas flow amplifier 115. More preferably, the inlet 112 has a first diameter that is smaller than a second diameter of the outlet 150 so that the secondary gas flow 185 spreads out more at the outlet 150 of the gas flow amplifier 115. In an alternative preferred configuration, a gas flow amplifier 115 comprises a central opening 130 that is substantially conical in shape with an inlet 112 having a smaller diameter than the outlet 150.

Figure 4:
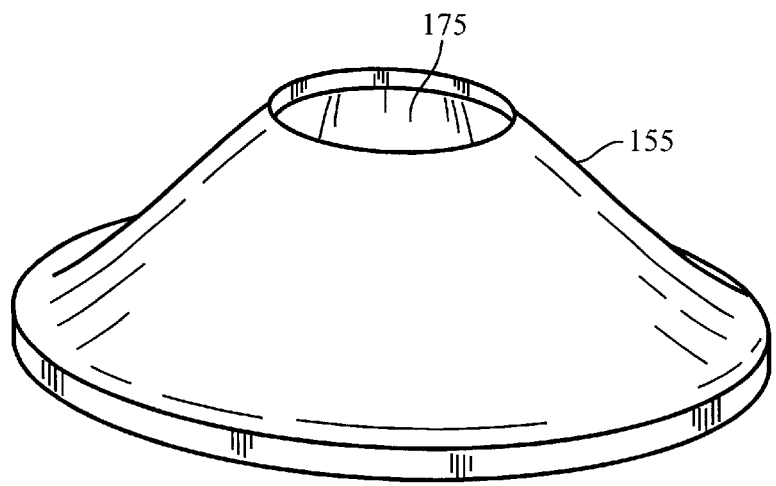
FIG. 4 is a perspective drawing of a gas deflector according to the present invention.

The gas deflector 155, which is typically disposed between the external surface 100 of the process chamber 125 and the outlet 150 of the gas flow amplifier 115, helps distribute gas flow to the periphery of the process chamber 25. The deflector 155 preferably comprises a conical surface 158 having a centrally positioned orifice 175 therethrough, as for example, illustrated in FIG. 4. The central orifice 175 permits a portion of the gas to flow directly onto the surface 100 of the process chamber 25. The cone-shaped surface 158 deflects gas radially outward to flow more evenly onto the outer portions of the process chamber 25. More preferably, the deflector 155 is flared on the side closest to the process chamber 25 to give the gas flow a more radial velocity component. The diameter of the gas deflector 155 is preferably at least as large as the diameter of the gas flow amplifier's outlet 150 and smaller than a diameter of a ceiling 45 of the process chamber 25; and more preferably, the diameter of the gas deflector 155 is at least 5% larger than the diameter of the gas flow amplifier's outlet 150. The surface and shape of the gas deflector 155 is designed to provide a smooth aerodynamic flow surface while deflecting a portion of the combined gas stream toward the periphery of the chamber surface 100 and allowing another portion to reach the center of the chamber surface 100.

The housing 110 surrounds at least a portion of the process chamber 125. In a preferred embodiment, the housing 110 completely surrounds the process chamber 25, although, even in this case, the process chamber 25 will usually have various valves, doors, and other connections allowing access, gas inputs, electric lines, etc., into the process chamber or other devices within the housing 110. The housing 110 also usually serves to partly or completely support the gas flow amplifier 115. The housing 110 is preferably cylindrical but may have other shapes or be irregularly shaped.

Another preferred feature of the temperature control system 95 are inner side walls 160 that help direct the flow of air toward the process chamber 25. The side walls 35 may also play a role in controlling the flow of gas out of the housing 110. For example, the side walls 35 may, in cooperation with the housing 110, form an annular passageway 180 for flow of the heated gas away from the process chamber 25 and toward the gas outlet 150.

Unlike conventional temperature control systems that recirculate gas through the housing, another aspect of the present invention comprises a housing 110 having vents 195 that are arranged so that surrounding gas flows into the inlet 112 of the housing 110 and gas that is passed across the surface 100 of the chamber 25 flows out of the housing 110 to the external environment through the vents 195. Thus, unlike conventional systems, the temperature control system 95 of the present invention does not need cooling coils or other heat exchangers within the housing 110 to cool or heat a recirculating flow of gas. To permit gas flow both in and out of the housing 110, preferably, the vents 195 are shaped and positioned to serve as both gas ingress ports 105 and gas egress ports 165. The gas ingress ports 105 are preferably located adjacent to or about the gas inlet 112 of the gas flow amplifier 115, and the gas egress ports 165 are located in the gas flow path after the gas passes across the chamber surface 100 to vent gas to the external environment. While described with reference to a gas flow amplifier, the novel housing 110 can also be used with other types of air circulating systems including, for example, fans, gas nozzles, blowers, and other types of gas flow amplifiers.

The temperature control system 95 described herein can be adapted to any process chamber 25. For example, the process chamber 25 can be a sputtering chamber (such as described in U.S. Pat. No. 5,108,570, incorporated herein by reference), an electron beam evaporator, a chemical vapor deposition (CVD) chamber, and other chamber designs. A CVD chamber is used to deposit layers of material by chemical vapor deposition, as for example described in U.S. Pat. No. 5,500,249, which is incorporated herein by reference. An epitaxial CVD reactor deposits from reactant gases, a thin single crystal layer of semiconducting material on the substrate 30, as for example described in U.S. Pat. No. 5,160,545, which is incorporated herein by reference. Generally, the epitaxial CVD reactor comprises a deposition chamber, a process gas supply for the introduction of process gas into the chamber, a substrate heating source, and an exhaust system to remove effluent gases. The epitaxial process is highly temperature-sensitive because the crystalline structure deposited on the substrate is dependent on the temperature of the substrate. Thus it is desirable to maintain the deposition chamber, and thereby the substrates, at a constant temperature. When the substrate heating source comprises heat lamps shining through a deposition chamber that is transparent to thermal radiation, it is also desirable to maintain the walls of the deposition chamber at a temperature below that at which deposition occurs to avoid deposits on the walls that would block the light from the heat lamps.

Referring to FIG. 3, the present invention provides a method in which a first gas stream 125 is directed toward the chamber's surface 100. The first gas stream 125 entrains a second gas stream 185 that forms a combined gas stream 190 with a flow rate higher than the flow rate of the first stream. Preferably, the flow rate of the combined gas stream 190 is about 5 to about 50 times larger than the first gas stream 125; more preferably, about 15 to 25 times larger.

The present invention also provides a method in which a sufficiently high flow of gas is directed at the surface 100 of a process chamber 25 to obtain temperature stability and/or uniformity at the surface 100 of the process chamber 25 that is superior to conventional methods. It has been found that the apparatus and methods according to the present invention provide surprisingly good results in temperature stability and uniformity on the surface 100 of a process chamber 25. It has been observed that these surprising results are obtained by directing a sufficiently high velocity gas flow stream, such as provided by a gas flow amplifier 115, at the surface 100 of a process chamber 25. These beneficial effects are seen, for example, in controlling the temperature of a plasma processing chamber 25. For a plasma process chamber 25 having a domed ceiling 45 with an external base diameter of about 14" that is warmed by the heat lamps 170, and running at a source RF power of 1400 W and a bias voltage of about 250 W, it has been found that the temperature at the ceiling's surface, from the center to the lower side edge of the ceiling 45, can be controlled to vary by less than 25° C., more preferably less than 20° C., and still more preferably less than 15° C. in both the idle and running modes. Also, the temperature at the center of the ceiling's surface can be controlled to vary by less than about 2° C., more preferably 1° C. or less when the processing chamber is switched between idle and running states. Further surprising results are observed by directing a sufficiently high gas flow at a surface 100 of a process chamber 25 such that, in the plasma processing chamber 25 described above, the difference in the change of temperature at the center and lower side of the dome-shaped ceiling 45 is less than about 25° C., more preferably about 20° C. or less. The present invention also includes methods of controlling the temperature of a process chamber 25 by directing a gas flow at the surface 100 of a process chamber 25, wherein the gas flow is sufficiently high such that it will achieve the aforementioned results when directed at the aforementioned plasma processing chamber 25.

EXAMPLES

The following examples illustrate some of the advantages of the present invention over the prior art. The examples illustrate comparative test results from a conventional temperature control system and a temperature control system 95 of the present invention. Both examples use the same process chamber 25 operating under the same process conditions except that the process chamber 25 in Example 1 used a bias voltage of 200 W while the chamber in Example 2 used a bias voltage of 250 W (this difference in bias voltages did not cause the changes observed in FIGS. 5 and 6). Temperature probes were placed at five locations (identically located in both Examples) on the outer (top) surface 100 of the process chamber 25 and monitored continuously. Temperature was monitored under 3 conditions: idle, RF power on, and RF power off. The inductor antenna 80 was operated at a source power level of 1400 W. When the source RF power was turned on (or plasma was ignited?), the power to the IR lamp was reduced by 20%.

Example 1

Conventional Chamber

This example utilized a conventional Dome Temperature Control Unit (DTCU) available from Applied Materials, Santa Clara, Calif.

The results from a temperature test of this apparatus are shown in FIG. 6. In the initial idle mode (flat section, left side of graph) the temperature at the top and central portion of the dome was 92° C., and temperature decreased moving away from the center showing probe temperatures of 82° C., 69° C., 62° C., and 54° C. After plasma ignition (right side of graph) the temperature of the probes increased −5, 3, 15, 21, and 25° C. respectively with a temperature variation dependent on the RF on/off state of ±3° C.

Example 2

This example illustrates the operation of the device illustrated in FIG. 3. The gas supplied to the gas amplifier 115 via its gas inlet 112 was clean room air at ambient pressure and temperature. A first gas stream 125 of clean, compressed air was injected from the high pressure nozzle into the gas amplifier's cylinder at a volumetric flow rate of 500 sccm to generate an air current of about 125 cubic feet per minute (cfm) from the amplifier's outlet 150. The gas amplifier 115 had a cone shaped internal volume and the diameter of the gas amplifier's inlet 112 and outlet 150 were 1" and 4", respectively. This provided a diameter ratio of about 1:4. A gas deflector 155, having an outside peripheral diameter of 4" and an inside hole diameter of 1", was positioned below the termination of the outlet 150. In operation, high pressure gas emitted from the nozzle 120 of the gas amplifier 115 strikes the gas deflector 155 and flows radially outward and down the sides of the chamber ceiling 45. The dimensions of the external housing 110 were approximately the same as those of the DTCU.

The results from a test of this apparatus are shown in FIG. 5. In the initial idle state (flat section, left side of graph) the temperature at the top, center of the ceiling 45 was 82° C., and temperature decreased moving away from the center to temperatures of 80° C., 77° C., 72° C., and 68° C. After plasma ignition (right side of graph) the temperature of the probes increased 1, 3, 3, 19, and 21° C. respectively with a temperature variation dependent on the RF state of ±3° C.

A comparison of the results show multiple advantages from the present invention. The temperature variation in the idle state from the center to the lower side of the ceiling 45 was 14° C. in the inventive example as compared with a 36° C. at the same locations in the conventional example. The temperature change observed due to switching from the idle state to the plasma-ignited state was less in the inventive example. For example, the temperature change at the center of the ceiling 45 was 1±3° C. versus −5±3° C. in the conventional example, and the temperature change at the lower side of the ceiling 45 was 21±3° C. in the inventive example versus 25±3° C. in the conventional example. Moreover, the difference of the temperature changes was much less in the inventive example (20° C., i.e., 21−1) versus 30° C. (i.e., 25−(−5)) in the conventional example. In addition, the switch from RF on to RF off and vice versa resulted in relatively gradual temperature shifts as compared to the sharp temperature changes observed in the conventional apparatus. Thus, far greater temperature stability is achieved in the present invention as compared to the conventional apparatus and methods.

The present invention provides numerous advantages. The temperature control system 95 according to the present invention is capable of maintaining uniform and constant temperatures across a surface 100 of a chamber 25 for varying heat loads and temperature fluctuations inside the chamber 25. For example, the invention can be used to control the temperature of a wall or ceiling of an apparatus that has adjacent components, such as inductor coils, gas flow meters, or process gas distributors. The temperature control system 95 of the present invention maintains a constant and uniform temperature across the surface, reduces the mechanical and thermal stresses on the surface, and provides consistent substrate processing rates. The invention can achieve superior temperature control without the use of a heat exchanger such as cooling coils. Nor does the temperature control system 95 of the present invention require a fan to move air and is thus less likely to suffer mechanical breakdowns or damage other components upon mechanical failure of the fan.

Although the present invention has been described in considerable detail with regard to the preferred versions thereof, other versions are possible. For example, the temperature control system 95 is suitable for controlling the temperatures of various surfaces of types of processing apparatus under varying thermal loads. Therefore, the appended claims should not be limited to the description of the preferred versions contained herein.

What is claimed is:

1. A temperature control system for controlling a temperature of a surface of an enclosure wall of a process chamber adapted to process a substrate, the temperature control system comprising a gas flow amplifier having a nozzle adapted to emit a gas flow stream that is directed toward the surface of the enclosure wall of the process chamber to control the temperature of the surface.

2. A temperature control system according to claim 1 wherein the gas flow amplifier is adapted to amplify the gas flow stream directed toward the surface of the enclosure wall of the process chamber.

3. A temperature control system according to claim 1 wherein the gas flow amplifier is adapted to direct a primary gas stream toward the surface of the enclosure wall of the process chamber thereby entraining a secondary gas stream also toward the surface of the enclosure wall of the process chamber, the primary gas stream comprising a volumetric flow rate that is lower than the volumetric flow rate of the secondary gas stream.

4. A temperature control system according to claim 3 wherein the secondary gas stream flows into an inlet and out of an outlet of the gas flow amplifier.

5. A temperature control system according to claim 1 comprising a reservoir of pressurized gas connected to the nozzle.

6. A temperature control system according to claim 5 wherein the gas flow amplifier comprises an inlet to receive gas and an outlet adapted to direct the received gas toward the surface of the enclosure wall of the process chamber, and wherein the nozzle is between the inlet and the outlet.

7. A temperature control system according to claim 6 wherein the nozzle is adapted to direct a primary gas stream toward the surface of the enclosure wall of the process chamber, whereby a secondary gas stream is induced to flow into the inlet and out of the outlet.

8. A temperature control system according to claim 6 wherein the nozzle is adapted to direct the gas flow stream toward the surface of the enclosure wall of the process chamber at at least about sonic velocities.

9. A temperature control system according to claim 1 wherein the nozzle comprises an opening sized from about 0.1 mils to about 50 mils.

10. A temperature control system according to claim 1 wherein the nozzle comprises an annular opening.

11. A temperature control system according to claim 6 wherein the inlet comprises a first diameter and the outlet comprises a second diameter, and wherein the first diameter is smaller than the second diameter.

12. A temperature control system according to claim 6 wherein the gas flow amplifier comprises a substantially conical surface between the inlet and the outlet.

13. A temperature control system according to claim 4 comprising a gas deflector between the outlet of the gas flow amplifier and the surface of the process chamber.

14. A temperature control system according to claim 13 wherein gas deflector comprises an orifice sized to allow at least partial flow of the gas therethrough.

15. A temperature control system according to claim 13 wherein gas deflector comprises a conical surface.

16. A temperature control system according to claim 1 further comprising a housing surrounding at least a portion of the surface of the enclosure wall of the process chamber and substantially enclosing the gas flow amplifier.

17. A temperature control system according to claim 16 wherein the housing comprises one or more vents to an external environment.

18. A temperature control system according to claim 1 wherein the gas flow amplifier further comprises a gas line connector adapted to receive pressurized gas from a pressurized gas source.

19. A temperature control system according to claim 1 wherein the temperature control system is absent a heat exchanger to transfer heat to or from the gas.

20. A substrate processing apparatus comprising:
(a) a process chamber comprising a support adapted to hold a substrate during processing of the substrate, the process chamber having a wall with a surface;
(b) a housing surrounding at least a portion of the surface of the wall of the process chamber; and
(c) a gas flow amplifier between the housing and the surface of the wall of the process chamber, the gas flow amplifier having a nozzle adapted to emit a gas flow stream that is directed toward the surface of the wall to control a temperature of the surface.

21. A substrate processing apparatus according to claim 20 wherein the surface comprises a dome shape.

22. A substrate processing apparatus according to claim 20 wherein the gas flow amplifier is adapted to direct a primary gas stream toward the surface of the wall of the process chamber thereby entraining a secondary gas stream also toward the surface of the wall of the process chamber, the primary gas stream comprising a volumetric flow rate that is lower than the volumetric flow rate of the secondary gas stream.

23. A substrate processing apparatus according to claim 22 wherein the secondary gas stream flows into an inlet and out of an outlet of the gas flow amplifier.

24. A substrate processing apparatus according to claim 20 wherein the gas flow amplifier comprises an inlet to receive gas and an outlet adapted to direct the received gas toward the surface of the wall of the process chamber, and wherein the nozzle is between the inlet and the outlet.

25. A substrate processing apparatus according to claim 20 wherein the nozzle is adapted to direct the gas flow stream toward the surface of the wall of the process chamber at at least about sonic velocities.

26. A substrate processing apparatus according to claim 20 wherein the housing comprises one or more vents to an external environment.

27. A substrate processing apparatus comprising:
(a) a process chamber comprising a support adapted to hold a substrate during processing of the substrate, the chamber having a wall comprising an outside surface;
(b) a housing surrounding at least a portion of the outside surface of the wall of the process chamber, the housing having one or more vents toan external environment; and
(c) a gas flow amplifier in the housing having a nozzle adapted to emit a gas flow stream that is directed against the outside surface of the wall of the process chamber to control a temperature of the outside surface.

28. An apparatus according to claim 27 wherein the vents comprise gas egress ports and gas ingress ports.

29. An apparatus according to claim 28 wherein a gas ingress port is located adjacent to the gas flow amplifier.

30. An apparatus according to claim 28 wherein a gas egress port is located such that the gas flow stream flows past the outside surface of the wall of the process chamber before reaching the gas egress port.

31. An apparatus according to claim 27 wherein the only openings in the housing to the external environment are the vents.

32. An apparatus according to claim 27 wherein the process chamber comprises RF coils disposed around the outside surface.

33. A method of controlling the temperature of a surface of an enclosure wall of a process chamber adapted to process a substrate, the method comprising providing a gas flow amplifier having a nozzle capable of emitting a primary gas stream having a first flow rate and that is directed toward the surface of the enclosure wall to entrain a secondary gas stream to form a combined gas stream having a second flow rate and that is directed toward the surface of the enclosure wall to control the temperature of the surface, wherein the second flow rate is higher than the first flow rate.

34. A method according to claim 33 comprising passing a pressurized gas through an opening sized sufficiently small to provide a primary gas stream having at least about sonic velocities.

35. A method according to claim 33 comprising passing a pressurized gas through an opening sized from about 0.1 mil to about 50 mils.

36. A method according to claim 33 comprising directing the primary gas stream in a circular configuration.

37. A method according to claim 33 comprising directing the primary gas stream through a conical volume.

38. A method according to claim 33 comprising directing the primary gas stream through a conical volume comprising an inlet and an outlet for the secondary gas stream, the inlet comprising a first diameter and the outlet comprising a second diameter, and the first diameter being smaller than the second diameter.

39. A method according to claim 33 comprising at least partially deflecting the secondary gas stream before it reaches the surface.

40. A method according to claim 33 comprising deflecting a portion of the secondary gas stream toward a periphery of the surface and allowing another portion to reach a center of the surface.

41. A method of controlling the temperature of a surface of an enclosure wall of a process chamber adapted to process a substrate, the method comprising providing a gas flow amplifier having a nozzle capable of emitting a first gas stream that is directed toward the surface of the enclosure wall at a velocity that is sufficiently high to entrain the flow of a second gas stream that includes the first gas stream against the surface of the enclosure wall to control the temperature of the surface.

42. A method according to claim 41 comprising directing the first gas stream at a first volumetric flow rate to entrain the flow of a second gas stream at a second volumetric flow rate that is higher than the first volumetric flow rate.

43. A method according to claim 42 wherein the second volumetric flow rate is at least 5 times larger than the first volumetric flow rate.

44. A method according to claim 42 comprising directing the first gas stream at at least about sonic velocities.

45. A plasma processing apparatus capable of processing a substrate, the apparatus comprising:
(a) a process chamber comprising RF coils disposed around an external surface of a wall of the process chamber;
(b) a housing surrounding at least a portion of the external surface of the wall of the process chamber; and
(c) a gas flow amplifier located between the housing and the external surface of the wall of the process chamber, the gas flow amplifier having a nozzle adapted to emit a gas flow stream that is directed toward the external surface of the wall to control the temperature of the external surface.

46. A substrate processing apparatus according to claim 45 wherein the gas flow amplifier is adapted to direct a primary gas stream toward the external surface of the wall of the process chamber thereby entraining a secondary gas stream also toward the external surface of the wall of the process chamber, the primary gas stream comprising a volumetric flow rate that is lower than the volumetric flow rate of the secondary gas stream.

47. A substrate processing apparatus according to claim 46 wherein the secondary gas stream flows into an inlet and out of an outlet of the gas flow amplifier.

48. A substrate processing apparatus according to claim 45 wherein the gas flow amplifier comprises an inlet to receive gas and an outlet adapted to direct the received gas toward the external surface of the wall of the process chamber, and wherein the nozzle is between the inlet and the outlet.

49. A substrate processing apparatus according to claim 45 wherein the nozzle is adapted to direct the gas flow stream toward the external surface of the wall of the process chamber at at least about sonic velocities.

50. A substrate processing apparatus according to claim 45 wherein the housing comprises one or more vents to an external environment.

51. A method of controlling the temperature of a surface of an enclosure wall of a process chamber adapted to process a substrate, the method comprising:
   (a) providing a housing surrounding at least a portion of the surface of the enclosure wall, wherein the housing comprises a gas ingress port and a gas egress port;
   (b) providing a gas flow amplifier to draw gas into the housing through the gas ingress port and propel the gas onto the surface of the enclosure wall to control the temperature of the surface; and
   (c) expelling the gas out of the housing through the gas egress port.

52. The method of claim 51 wherein the method is absent a heat exchanger.

53. The method of claim 52 wherein the process chamber comprises a dome and wherein a portion of the gas impacts directly on a center of the dome and another portion of the gas is directed away from the center and onto the sides of the dome.

54. A method according to claim 51 comprising propelling a primary gas stream toward the surface of the enclosure wall of the process chamber thereby entraining a secondary gas stream also toward the surface of the enclosure wall of the process chamber, the primary gas stream comprising a volumetric flow rate that is lower than the volumetric flow rate of the secondary gas stream.

55. A method according to claim 51 comprising propelling the gas toward the surface of the enclosure wall of the process chamber at at least about sonic velocities.

56. A method of controlling the temperature of a surface of an enclosure wall of a plasma process chamber adapted to process a substrate, the method comprising providing a gas flow amplifier having a nozzle capable of emitting a gas flow stream that is directed toward the surface of the enclosure wall of the plasma process chamber to control the temperature of the surface, wherein the gas flow rate of the gas flow stream is sufficiently high such that if the gas flow stream were directed at the surface of an enclosure wall of a plasma process chamber having a dome with an external base diameter of about 14" that is warmed by heat lamps, and running a plasma with a source RF power of 1400 W and a bias voltage of about 250 W, the difference in the change of temperature at the center and lower side of the dome's surface would be less than about 25° C.

* * * * *